United States Patent [19]
Horichi

[11] 3,970,870
[45] July 20, 1976

[54] SIGNAL RECTIFYING CIRCUIT
[75] Inventor: Tetsuya Horichi, Yokohama, Japan
[73] Assignee: Sony Corporation, Tokyo, Japan
[22] Filed: Nov. 14, 1974
[21] Appl. No.: 523,857

[30]  Foreign Application Priority Data
Nov. 30, 1973  Japan .................. 48-138761[U]

[52] U.S. Cl. .................................. 307/261; 328/26
[51] Int. Cl.² ........................................... H03K 5/00
[58] Field of Search .................. 307/255, 261, 262; 328/26, 133, 135, 148

[56]  References Cited
UNITED STATES PATENTS

| | | | |
|---|---|---|---|
| 3,099,000 | 7/1963 | Dunning | 328/148 X |
| 3,391,249 | 7/1968 | Becker et al. | 328/135 X |
| 3,479,463 | 11/1969 | Dias | 328/133 X |
| 3,649,851 | 3/1972 | Cohen | 307/262 X |

*Primary Examiner*—Paul L. Gensler
*Attorney, Agent, or Firm*—Hill, Gross, Simpson, Van Santen, Steadman, Chiara & Simpson

[57]  ABSTRACT

A signal rectifying circuit which is capable of providing rectification either with a balanced or unbalanced input and wherein the output comprises an undelayed signal. A pair of transistors of opposite type are coupled to the input circuit such that they alternately conduct with the positive and negative half cycles of the input signal and wherein a third transistor is coupled to the pair of input transistors such that it conducts during both the positive and negative portions of the input wave so as to provide a rectified output signal. A second embodiment provides a pair of diodes interconnected with the rectifying circuit so as to remove the time delay normally resulting due to the voltage required to bias a transistor to conduction.

6 Claims, 8 Drawing Figures

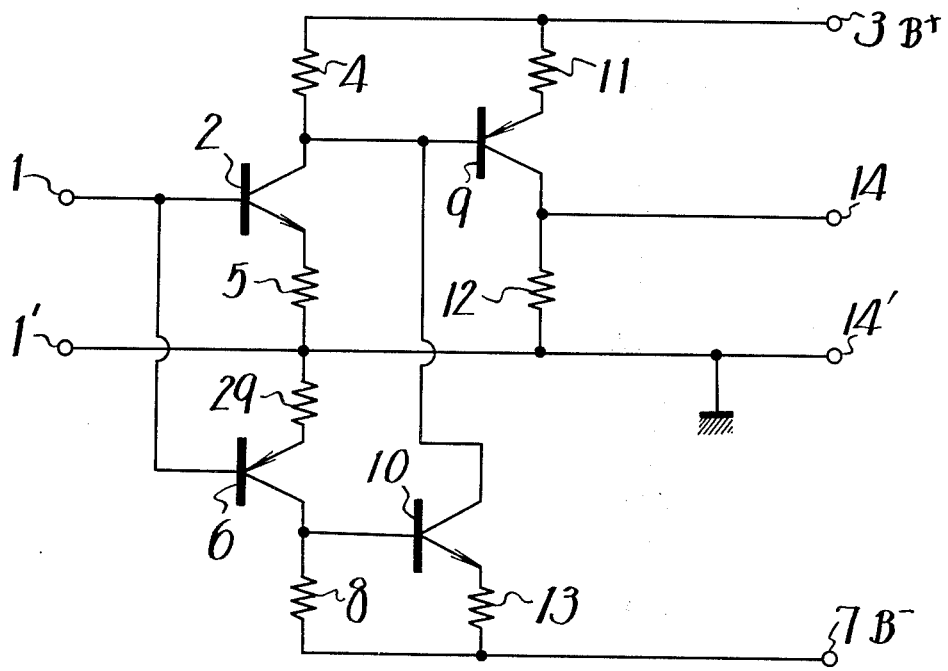
*Fig.*-1
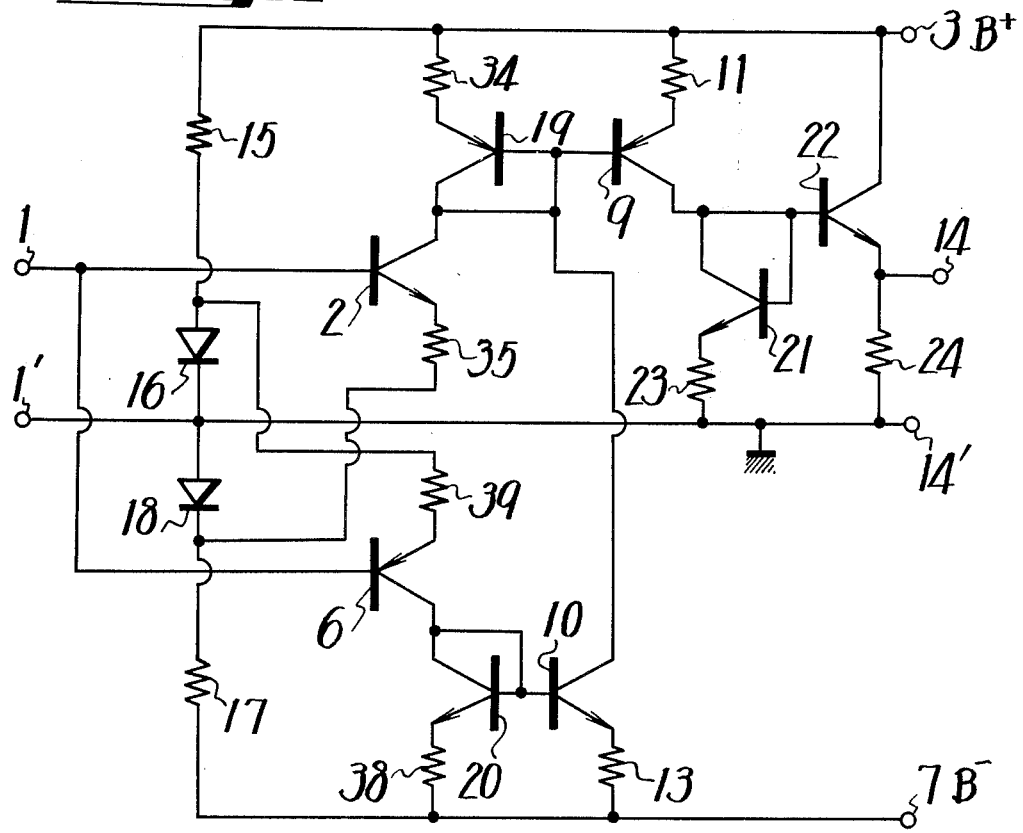
*Fig.*-4

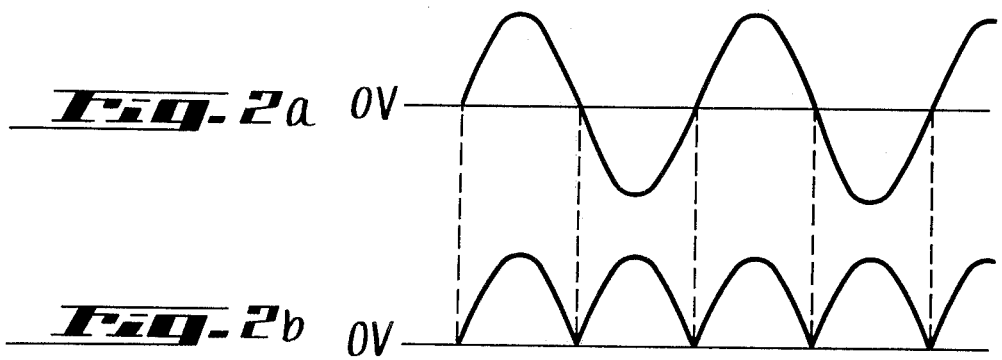
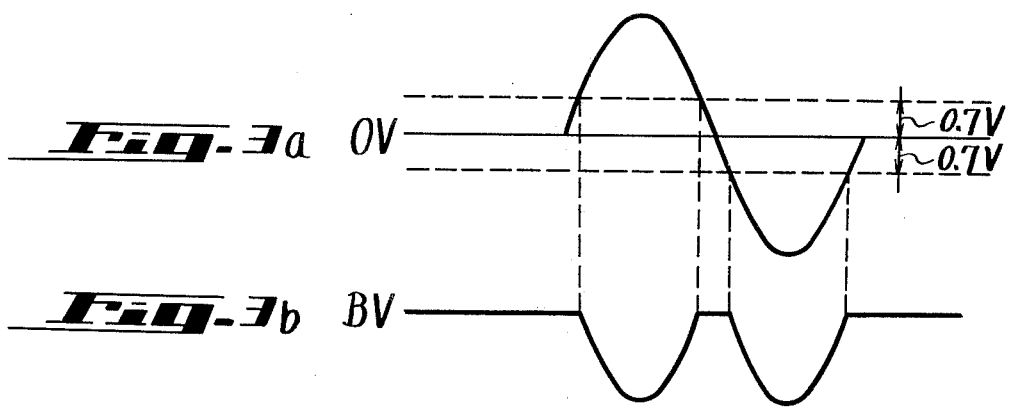
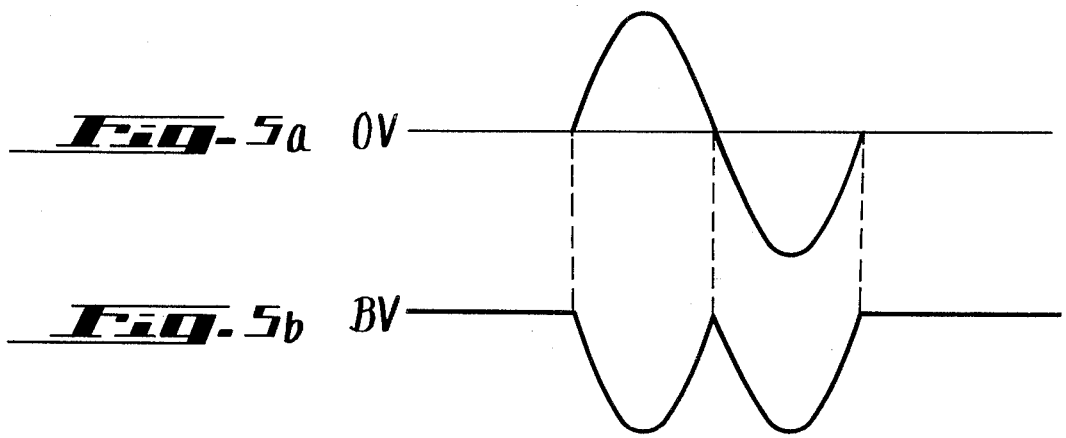

SIGNAL RECTIFYING CIRCUIT

BACKGROUND OF THE INVENTION

1. Field of the Invention

This invention relates in general to rectifier circuits and in particular to an improved rectifier circuit capable of operating with both balanced and unbalanced inputs.

2. Description of the Prior Art

Rectifying circuits of the prior art generally require balanced inputs. This is sometimes a disadvantage in that signals which are to be rectified must be converted to a balanced input before they can be applied to the rectifier circuit.

SUMMARY OF THE INVENTION

The present invention provides a signal rectifying circuit capable of accepting balanced or unbalanced inputs and which includes a pair of transistors to which the input signal is applied and which are alternately caused to conduct on the positive and negative half cycles of the input wave and further including at least one output transistor which is coupled to both of the input transistors so that it conducts on both the positive and negative half cycles of the input wave but provides an output which has a single polarity. The coupling between the output transistor and the second of the input transistors is through a fourth transistor. The circuit, thus, is capable of operating with either balanced or unbalanced inputs and provides a symmetrical output signal.

A second embodiment of the invention includes diode means coupled to the input transistors of the first embodiment so as to compensate for the bias voltage required for a transistor thus eliminating time lag between the output half-wave pulses. In other words, since transistors require a certain bias voltage before turn-on without the compensation of the second embodiment, time spacing occurs between the positive half cycles of the output rectified wave. However, the second embodiment eliminates such time spacing and provides a substantially improved rectifier circuit. Means are provided for converting the output impedance from high to low so as to couple into a circuit having a particular impedance.

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which:

BRIEF DESCRIPTION OF THE DRAWINGS

FIG. 1 is an electrical schematic of the invention;

FIG. 2a illustrates an input wave form;

FIG. 2b illustrates a rectified output signal;

FIG. 3a illustrates an output signal with turn-on bias voltages illustrated;

FIG. 3b illustrates a turn-on characteristic of a transistor;

FIG. 4 is an electrical schematic of a modification of the invention;

FIG. 5a illustrates an input signal; and

FIG. 5b illustrates the conduction characteristic of a transistor which has been compensated for its turn-on bias.

DESCRIPTION OF THE PREFERRED EMBODIMENTS

FIG. 1 illustrates a pair of input terminals 1 and 1' with input terminal 1 connected to the base of a transistor 2 which is illustrated as an NPN type and which has its emitter connected to a resistor 5 that has its other side connected to input terminal 1'. Input terminal 1 is also connected to the base of a transistor 6 which is illustrated as a PNP type which has its emmiter connected to a resistor 29 which has its other side connected to input terminal 1'. The collector of transistor 2 is connected to the base of a transistor 9 which is illustrated as a PNP type and which has its collector connected to an output terminal 14. A second output terminal 14' is connected to the input terminal 1' and is grounded, and a resistor 12 is connected between the output terminals 14 and 14'. A B+ bias source is connected to a terminal 3. A resistor 11 is connected between terminal 3 and the emitter of transistor 9. The terminal 3 is connected to one side of a resistor 4 which is connected to the collector of transistor 2.

A transistor 10 which is illustrated as an NPN type has its base connected to the collector of transistor 6 and its collector connected to the base of transistor 9 and to the collector of transistor 2. A negative bias source B− is connected to a terminal 7 which is connected to a resistor 13 which has its other side connected to the emitter of transistor 10. A resistor 8 is connected between the collector of transistor 6 and terminal 7.

When an input alternating current signal is applied between terminals 1 and 1' and during the positive half cycle, transistor 2 will be biased to conduction and transistor 6 will be biased to cutoff because its base will be biased to a potential higher than its emitter. Transistor 9 will be turned on when transistor 2 conducts; and thus, the positive half cycle will appear between terminals 14' and 14 across resistor 12.

When the input signal reverses and the negative half cycle is applied to terminals 1 and 1', transistor 2 is turned off and transistor 6 is turned on. When transistor 6 turns on, transistor 10 is biased to conduction which turns on transistor 9 because the base of transistor 9 is connected to the collector of transistor 10. Thus, the conduction of transistor 6 during the negative half cycle will cause conduction of transistor 9 and a positive half cycle will appear between terminals 14 and 14' due to conduction of transistor 9 which carries current from the B+ terminal 3 through resistor 12. Thus, during both the negative and positive half cycles of the applied signal, the positive half cycles will appear at terminals 14 and 14'.

The total gain for the positive half cycles of the input signal is determined by the values of resistors 4, 5, 11, and 12; and the total gain for the negative half cycle of the input signal is determined by the values of resistors 29, 8, 4, and 13.

Actually, in silicon-type transistors, they do not start to conduct until the bias reaches a value of 0.7 volts, for example, as illustrated in FIG. 3a. when the applied voltage is supplied to terminals 1 and 1' in the circuit of FIG. 1, the transistors will not be biased to conduction until the bias reaches a point of 0.7 volts as illustrated in dotted line in FIG. 3a. FIG. 3b illustrates the voltage on the collector of transistor 2; and thus, the signal will be clipped due to the threshold voltages of transistors 2 and 6 and there will be a spacing equal to the clipped distance illustrated between the two negative half pulses in FIG. 3b between the positive output pulses. This is undesirable, and the circuit of FIG. 4 corrects this. A pair of diodes 16 and 18 are connected in series with the resistors 15 and 17 between terminals 3 and 7 with the cathode of diode 16 connected to input terminal 1' and the anode of diode 18 connected to input terminal 1'. If the diodes 16 and 18 are made of silicon, they will have the same voltage drop characteristic as the transistors or a voltage of 0.7 across them. Current will continuously flow through the diodes 16 and 18; and thus, 0.7 volts will continue to exist across the diodes.

The emitter of transistor 6 is connected through a resistor 39 to the anode of diode 16 and the emitter of transistor 2 is connected through a resistor 35 to the collector of diode 18. A resistor 34 is connected between the emitter of a transistor 19 and terminal 3. The collector of transistor 19 is connected to the collector of transistor 2. The base of transistor 9 is connected to the base of transistor 19 and to the collector of transistor 2. A resistor 38 is connected between terminal 7 and the emitter of a transistor 20 which has its collector connected to the collector of transistor 6. The base of transistor 20 is connected to the base of transistor 10 which is also connected to the collector of transistor 6.

In the circuit of FIG. 4 rather than removing the output between the collector of transistor 9 and ground, a pair of transistors 21 and 22 are utilized so as to provide a low impedance output. The transistor 21 has its base and collector connected to the collector of transistor 9 and its emitter is connected through a resistor 23 to input terminal 1' and to the output terminal 14'. A transistor 22 has its base connected to the collector of transistors 9 and 21 and to the base of transistor 21 and has its collector connected to terminal 3 and its emitter connected to output terminal 14. A resistor 24 is connected between output terminals 14 and 14' as shown.

The circuit of FIG. 4 eliminates the clipping illustrated in FIG. 3b.

When the input terminals 1 and 1' receive the signal illustrated in FIG. 5a, the voltage at the collector of transistor 2 will be of the shape illustrated in FIG. 5b. It is to be noted that there is no clipping or time lag between the positive and negative half cycles of the applied signal and thus transistor 9 will provide an output signal illustrated in FIG. 2b without clipping. FIG. 2a illustrates the input signal at terminals 1 and 1' and the signal illustrated in FIG. 2b exists at the output terminals 14 and 14'. The additional transistors 19 and 20 in FIG. 4 avoid signal clipping by the transistors 9 and 10; and consequently, the current flowing through transistor 9 will be the same current as that which flows through transistor 2 provided that the resistors 34 and 11 have the same values.

The transistors 21 and 22 and resistor 23 merely convert the output impedance to a low value. The output impedance of the circuit of FIG. 1 has a high impedance and the output impedance of the circuit of FIG. 4 has a low impedance.

It is seen that this invention provides a novel rectifier circuit; and although it has been described with respect to preferred embodiments, it is not to be so limited as changes and modifications may be made which are within the full intended scope as defined by the appended claims.

I claim as my invention:

1. A signal rectifying circuit adapted for rectifying an input terminal signal having first and second polarity cycles with respect to a reference terminal, comprising:
   a. an input terminal;
   b. a reference terminal;
   c. a first signal input means connected between the input and reference terminals for inverting at least a portion of the first polarity signal cycle;
   d. a second signal input means connected between the input and reference terminals for inverting at least a portion of the second polarity signal cycle;
   e. a signal inversion means connected to said second signal input means for further inverting at least a portion of said second polarity signal cycle; and
   f. an output signal means connected to both said first signal input means and signal inversion means for providing a rectified output between an output terminal and said reference terminal.

2. The signal rectifying circuit of claim 1 in which said first and second signal input means comprise transistor devices of opposite polarity types, said signal inversion means comprises a transistor device of the same polarity as said first input means transistor device, and said output signal means comprises a transistor device of the same polarity as said second signal input means transistor device.

3. The signal rectifying circuit of claim 1 in which a low impedance output means is connected to said output signal means to lower the output impedance from said signal rectifying circuit.

4. The signal rectifying circuit of claim 1 in which semiconductor device means are connected to said signal inversion means and output signal means for preventing signal clipping in said latter two means.

5. The signal rectifying circuit of claim 1 which further includes biasing means connected to each of said first and second input circuit means to permit inversion of substantially all of said first and second polarity signal cycles, respectively.

6. The signal rectifying circuit of claim 5 which include a pair of unilateral current devices connected to said biasing means and to said first and second signal input means to provide invention of substantially all of said first and second polarity signal cycles, respectively.

* * * * *